United States Patent
Patti (10) Patent No.: US 11,658,181 B2
(45) Date of Patent: May 23, 2023

(54) HEMT POWER DEVICE OPERATING IN ENHANCEMENT MODE AND MANUFACTURING PROCESS THEREOF

(71) Applicant: STMICROELECTRONICS S.r.l., Agrate Brianza (IT)

(72) Inventor: Davide Giuseppe Patti, Mascalucia (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 407 days.

(21) Appl. No.: 16/775,843

(22) Filed: Jan. 29, 2020

(65) Prior Publication Data

US 2020/0243518 A1 Jul. 30, 2020

(30) Foreign Application Priority Data

Jan. 29, 2019 (IT) .................. 102019000001265

(51) Int. Cl.
*H01L 27/088* (2006.01)
*H01L 21/8236* (2006.01)
(Continued)

(52) U.S. Cl.
CPC ...... *H01L 27/0883* (2013.01); *H01L 21/8236* (2013.01); *H01L 21/8258* (2013.01); *H01L 29/16* (2013.01); *H01L 29/2003* (2013.01); *H01L 29/205* (2013.01); *H01L 29/66462* (2013.01); *H01L 29/66712* (2013.01);
(Continued)

(58) Field of Classification Search
CPC ........... H01L 27/0883; H01L 21/8236; H01L 21/8258; H01L 29/16; H01L 29/2003; H01L 29/205; H01L 29/66462; H01L 29/66712; H01L 29/7786; H01L 29/781; H01L 21/82345; H01L 21/823456; H01L 21/823462; H01L 27/0688; H01L 27/085; H03K 17/6871

See application file for complete search history.

(56) References Cited

U.S. PATENT DOCUMENTS

2012/0153300 A1 6/2012 Lidow et al.
2014/0091852 A1* 4/2014 Norling ............... H03K 17/102
327/409
(Continued)

OTHER PUBLICATIONS

Ben-Yaakov, et al., "A Novel Circuit Topology for Turning a 'Normally On' GaN Transistor into 'Normally Off' that Can be Driven by Popular Drivers," *Bodo's Power Systems*, Jun. 2018, 3 pages.

*Primary Examiner* — Selim U Ahmed
(74) *Attorney, Agent, or Firm* — Seed Intellectual Property Law Group LLP (57) ABSTRACT

The power device is formed by a D-mode HEMT and by a MOSFET in cascade to each other and integrated in a chip having a base body and a heterostructure layer on the base body. The D-mode HEMT includes a channel area formed in the heterostructure layer; the MOSFET includes a first and a second conduction region formed in the base body, and an insulated-gate region formed in the heterostructure layer, laterally and electrically insulated from the D-mode HEMT. A first metal region extends through the heterostructure layer, laterally to the channel area and in electrical contact with the channel area and the first conduction region.

20 Claims, 9 Drawing Sheets

(51) Int. Cl.
*H01L 21/8258* (2006.01)
*H01L 29/16* (2006.01)
*H01L 29/20* (2006.01)
*H01L 29/205* (2006.01)
*H01L 29/66* (2006.01)
*H01L 29/778* (2006.01)
*H01L 29/78* (2006.01)
*H03K 17/687* (2006.01)

(52) U.S. Cl.
CPC ........ *H01L 29/7786* (2013.01); *H01L 29/781* (2013.01); *H03K 17/6871* (2013.01)

(56) References Cited

U.S. PATENT DOCUMENTS

| | | |
|---|---|---|
| 2016/0133627 A1 | 5/2016 | Hirler |
| 2016/0293597 A1 | 10/2016 | Curatola et al. |
| 2019/0081078 A1* | 3/2019 | Miyano ............... H01L 29/0649 |

* cited by examiner

HEMT POWER DEVICE OPERATING IN ENHANCEMENT MODE AND MANUFACTURING PROCESS THEREOF

BACKGROUND

Technical Field

The present disclosure relates to a HEMT power device, operating in enhancement mode, and to the manufacturing process thereof.

Description of the Related Art

As is known, HEMTs (High-Electron-Mobility Transistors), also known as HFETs (Heterostructure Field-Effect Transistors) or as MODFETs (Modulation-doped Field-Effect Transistors), are encountering wide diffusion due to their capacity to operate at high frequencies, as well as to withstand high breakdown voltages. In particular, HEMT devices based upon Si—GaN (or GaN-On-Si "Gallium-Nitride-On-Silicon") technology are increasingly widespread due to their low cost and high scalability.

In particular, HEMTs based upon Si—GaN technology have extensive application in power-converter devices. These, as known, basically comprise a control stage and at least one power element, generally integrated in separate chips.

In particular, there are two main N-types of HEMTs based upon GaN-On-Si technology:
- transistors operating in enhancement mode (E-mode), normally off; i.e., they are off when the gate-to-source voltage Vgs is zero and require a positive Vgs voltage (Vgs>0 V) to switch on; and
- transistors operating in depletion mode (D-mode), normally on; i.e., they are on when the voltage Vgs is zero and require a negative Vgs voltage (Vgs<0 V) to switch off.

D-mode transistors are more mature, are intrinsically more robust and reliable than transistors that operate in E-mode. However, D-mode transistors are not compatible with the drivers of power converters, normally designed to work with E-mode transistors. For this reason, generally D-mode transistors are operatively converted into E-mode transistors, off at zero Vgs, using a cascade, mode-conversion circuit. To this end, the mode-conversion circuit is formed separately from the D-mode transistor and is connected thereto via wired connections during assembly at package or board level. However, the presence of interconnection wires limits the maximum switching frequency usable in high-frequency applications, such as in power converters, and requires a large board area. In addition, it also causes a reduction in power-conversion efficiency.

BRIEF SUMMARY

The present disclosure provides a HEMT power device that overcomes the drawbacks of the prior art.

According to embodiments of the present disclosure, a HEMT power device and the manufacturing process thereof are provided, as defined in the claims.

In practice, a power device is provided, that integrates, in a same chip, a D-mode HEMT and a conversion transistor; the latter causes the power device to operate in enhancement mode (E-mode) and enables the D-mode HEMT to be driven using the same driver as that for an E-mode transistor. No connection wires are therefore necessary between the conversion transistor and the D-mode HEMT. Specifically, the conversion transistor of, e.g., a MOSFET type, is formed in the substrate of a semiconductor material (for example, silicon) underneath the heterostructure layer of the D-mode HEMT; the substrate also assumes an electrically active function. Note that conventionally, a substrate in a HEMT device does not normally have an own electrical function, but functions purely as a mechanical support.

According to an aspect of the disclosure, in the present power device, the chip of semiconductor material that integrates both the D-mode HEMT and the MOSFET conversion transistor has a first, a second and a third external connection terminal, wherein the first external connection terminal is coupled to a first conduction terminal of the D-mode HEMT, a second conduction terminal of the D-mode HEMT is coupled to a first conduction terminal of the MOSFET, a second conduction terminal of the MOSFET is coupled to the second external connection terminal and a gate terminal of the MOSFET is coupled to the third external connection terminal.

For instance, if the MOSFET is an N-channel MOSFET (P-type substrate), the drain terminal of the D-mode HEMT is connected to the first external connection terminal, the source terminal of the D-mode HEMT is connected to the drain terminal of the MOSFET, and the source terminal of the MOSFET is connected to the second external connection terminal. If the MOSFET is a P-channel MOSFET (N-type substrate), the drain terminal of the D-mode HEMT is connected to the first external connection terminal, the source terminal of the D-mode HEMT is connected to the source terminal of the MOSFET, and the drain terminal of the MOSFET is connected to the second external connection terminal.

The gate terminal of the D-mode HEMT may be coupled to a fourth external connection terminal of the chip, if present, or may be coupled to the second external connection terminal.

Moreover, the chip of semiconductor material may include a fifth external connection terminal coupled to the intermediate point between the second conduction terminal of the D-mode HEMT (source) and the first conduction terminal of the MOSFET (source or drain, according to the channel type of the MOSFET).

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figures 1, 2:
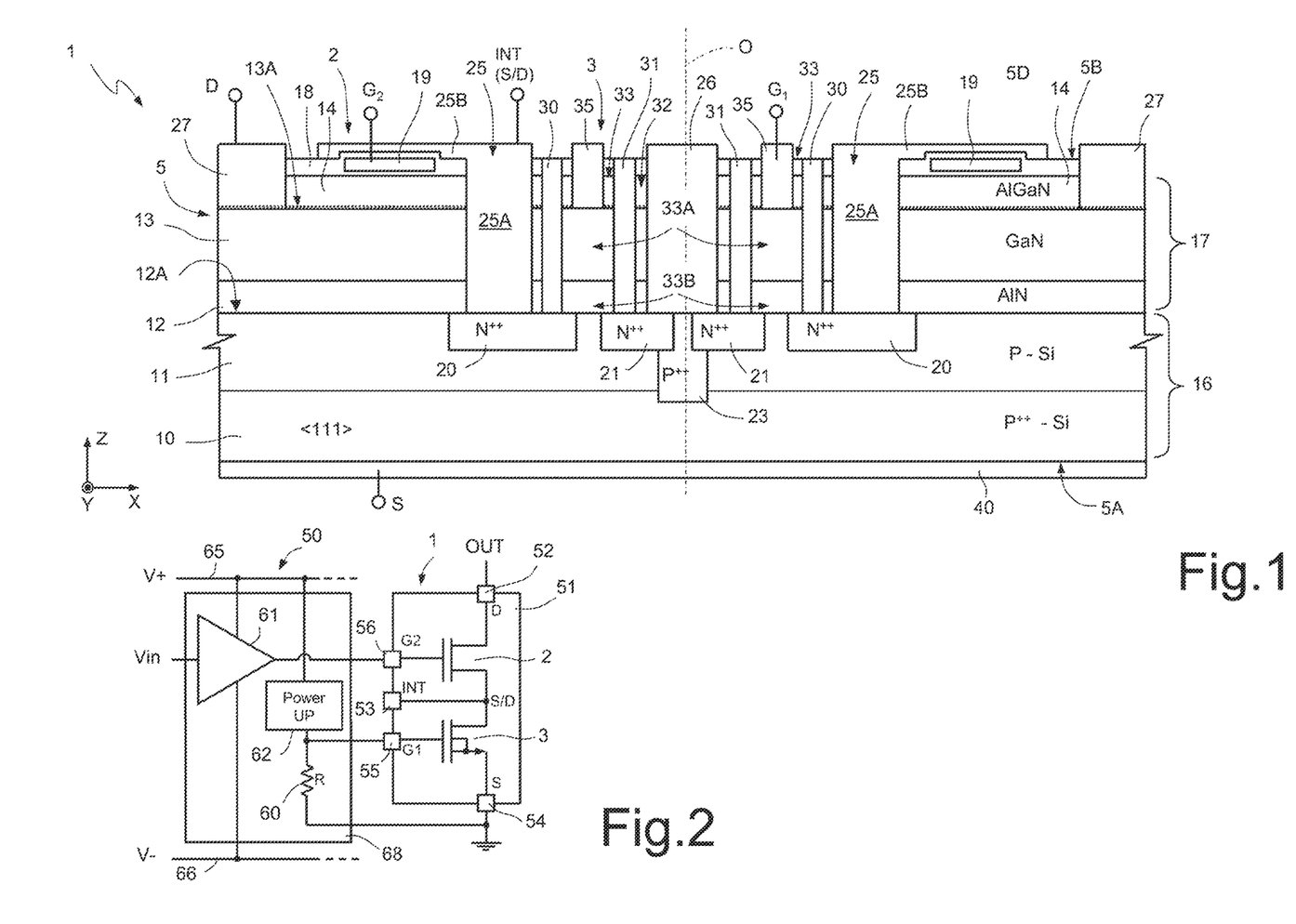
FIG. 1 is a cross-section of the present HEMT power device according to an embodiment.
FIG. 2 is an electrical diagram of a circuit including the HEMT power device of FIG. 1.
Figure 1A:
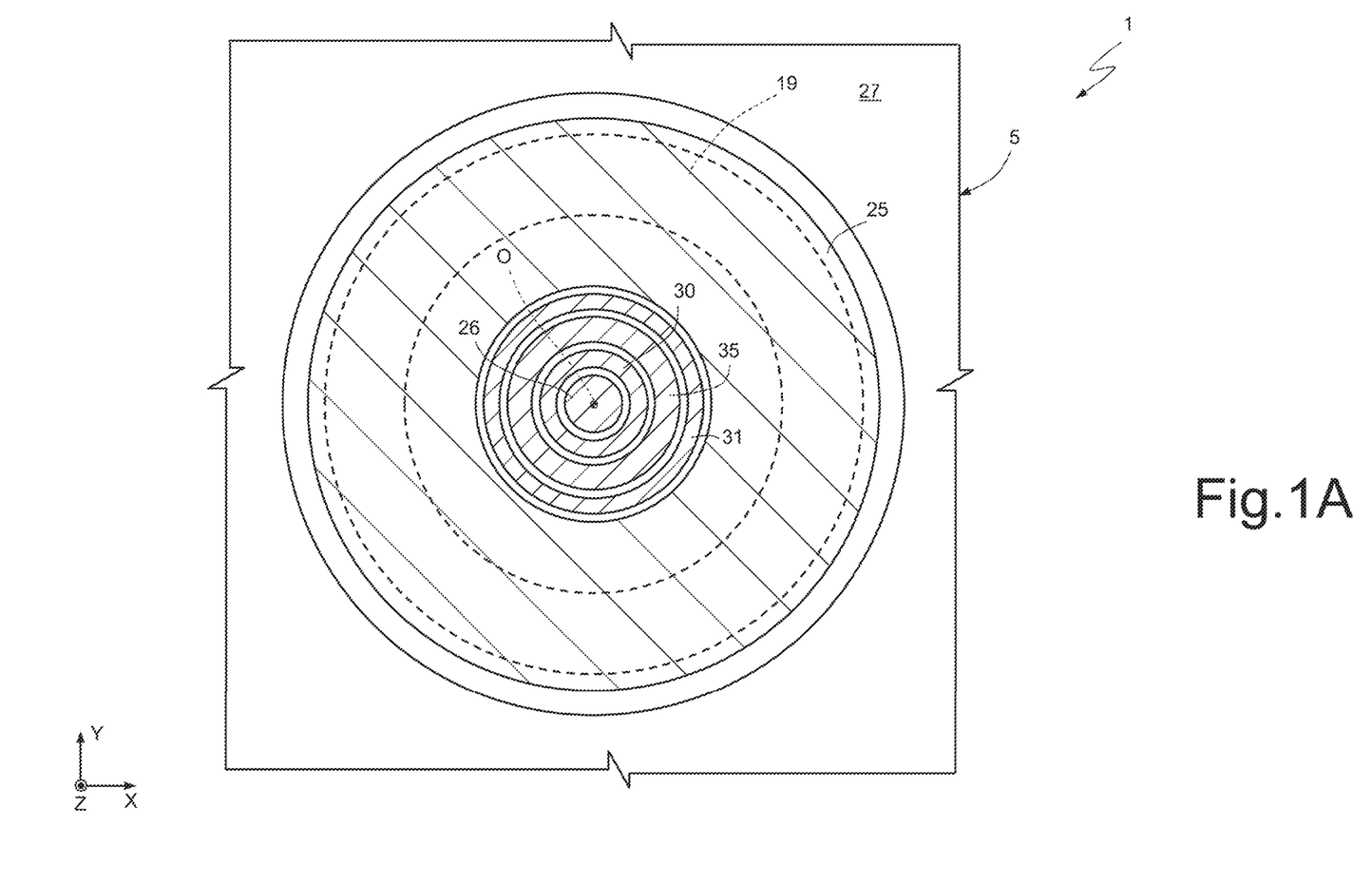
FIG. 1A is a top plan view of a possible implementation of the HEMT power device of FIG. 1.

FIGS. 1 and 1A show a power device 1 integrating a D-mode HEMT 2 in Si—GaN technology and a MOSFET 3, cascaded to each other. It will be noted that, as explained below in greater detail, the structure of FIG. 1 (showing the cross-section in a plane XZ of a Cartesian reference system XYZ) may have different implementations as regards the geometry in a third direction Y perpendicular to the drawing plane. In particular, the regions and structures of FIG. 1 may extend along lines parallel to axis Z, or have a circular and/or annular development with a different shape and symmetry, as discussed hereinafter. Specifically, FIG. 1A relates to an embodiment with circular symmetry with respect to a central axis O, and the following description refers to this topology.

In detail, the power device 1 of FIGS. 1 and 1A comprises a body 5 formed by a stack of layers superimposed on each other and in direct mutual contact, including a substrate 10, of silicon, here of a P-type with a crystallographic orientation <111>; an epitaxial layer 11, also of P-type silicon, less doped than the substrate 10; a dielectric layer 12, for example, of aluminum nitride (AlN); a channel layer 13, here of gallium nitride (GaN); and a barrier layer 14, here of aluminum gallium nitride (AlGaN). An insulation/passivation layer 18 extends over the surface of the barrier layer 14. A first gate region 19, with annular shape, hereinafter also referred to as "HEMT gate region", is formed inside the insulation/passivation layer 18.

The substrate 10 and the epitaxial layer 11 as a whole form a base layer 16 and have a first interface 12A with the dielectric layer 12. The channel layer 13, the barrier layer 14, and the dielectric layer 12, as a whole, form a heterostructure layer 17. The channel layer 13 and the barrier layer 14 form a second interface 13A between them, where free electrons are present, as represented schematically in FIG. 1. The body 5 also has a bottom surface 5A, formed by the substrate 10, and a top surface 5B, formed by the insulation/passivation layer 18.

In the embodiment shown in FIG. 1, the silicon layer 16 accommodates a drain region 20 and a source region 21, both of N-type and with a same doping level, extending inside the epitaxial layer 11 from the first interface 12A. Furthermore, in the embodiment shown, the drain region 20 surrounds the source region 21.

An enhanced region 23, of P-type and a higher doping level than the epitaxial layer 11, extends from the first interface 12A between and partially underneath the source region 21 as far as approximately the substrate 10. In the embodiment shown, the drain region 20 and the source region 21 have a circular ring shape, and the enhanced region 23 has a circular shape.

The power device 1 comprises a first, a second and a third metal region 25, 26, 27.

The first metal region 25, which is circular ring-shaped in the top plan view of FIG. 1A, comprises a tubular portion 25A and a surface portion 25B. The tubular portion 25A of the first metal region 25 extends vertically through the insulation/passivation layer 18 and the heterostructure layer 17 as far as and in electrical contact with the drain region 20; the surface portion 25B extends over the surface 5B of the body 5 above the HEMT gate region 19. In practice, the surface portion 25B of the first metal region 25 has a larger external diameter than the external diameter of the HEMT gate region 19 and a smaller internal diameter than the internal diameter of the HEMT gate region 19. Furthermore, the tubular portion 25A of the first metal region 25 has a smaller external diameter than the internal diameter of the HEMT gate region 19 and approximately equal to the external diameter of the drain region 20, and has a larger internal diameter (coinciding with the internal diameter of the surface portion 25B) than the internal diameter of the drain region 20.

The second metal region 26 has, in the top plan view of FIG. 1A, a circular shape, and extends through the insulation/passivation layer 18 and the heterostructure layer 17 as far as, and in electrical contact with, the source region 21 and the enhanced region 23. In particular, the second metal region 26 has a larger diameter than the smaller diameter of the source region 21. In practice, the second metal region 26 is surrounded at a distance by the first metal region 25, is crossed by the central axis O, and short-circuits the enhanced region 23 and therefore the substrate 10 with the source region 21.

The third metal region 27 extends on the channel layer 13, through the barrier layer 14 and the insulation/passivation layer 18, is in direct electrical contact with and surrounds at a distance the first metal region 25.

A first and a second electrical-insulation regions 30, 31, for example of silicon oxide or silicon nitride and having the shape of cylindrical walls, extend vertically and concentrically through the insulation/passivation layer 18 and the heterostructure layer 17 as far as the first interface 12A, between the tubular portion 25A of the first metal region 25 and the second metal region 26, at a distance therefrom and mutually spaced from each other. The first electrical-insulation region 30 extends vertically over the drain region 20 and is in direct contact therewith. The second electrical-insulation region 31 extends vertically over the source region 21 and is in direct contact therewith.

In practice, the first electrical-insulation region 30 is arranged externally with respect to the second electrical-insulation region 31, the second electrical-insulation region 31 surrounds a first portion 32 of the heterostructure layer 17 accommodating the second metal region 26, and the first and the second electrical-insulation regions 30, 31 delimit between them a second portion 33 of the heterostructure layer 17.

Therefore, the second portion 33 of the heterostructure layer 17 has a hollow cylindrical shape (tubular shape) and comprises a first part 33A, formed by the channel layer 13, and a second part 33B, formed by the dielectric layer 12. The first part 33A of the second portion 33 of the heterostructure layer 17 forms a gate region of the MOSFET 3, and the second part 33B of the second portion 33 of the heterostructure layer 17 forms a gate-dielectric region of the MOSFET 3. Consequently, the parts 33A and 33B are hereinafter also referred to as "MOSFET gate region 33A" and "MOSFET gate-dielectric region 33B". Therefore, the MOSFET 3 has here a circular symmetry (even though this is not mandatory, as mentioned above).

A fourth metal region 35 extends inside the second portion 33 of the heterostructure layer 17, through the insulation/passivation layer 18 and the barrier layer 14, and is in direct electrical contact with the channel layer 13. In this way, the fourth metal region 35 forms a gate metallization in contact with the MOSFET gate region 33A of the MOSFET 3.

A rear metal region 40 extends on the bottom surface 5A of the body 5.

In practice, in the power device 1, the MOSFET 3 is an N-channel MOSFET, since the base layer 16 is of a P-type.

In the power device 1 of FIG. 1, the base body 16 is formed by a monocrystal having a crystallographic orientation <111>.

Use of such an orientation requires adoption of some technological measures in the design step. In fact, active transistors used in integrated circuits are generally formed in substrates with crystallographic orientation <100>, having repeatability, reliability, and electronic mobility characteristics suited to MOS transistors. However, substrates with crystallographic orientation <100> are not adapted for growing GaN layers thereon. To enable integration of the MOSFET 3 in the substrate of the D-mode HEMT device 2, a substrate with a crystallographic orientation <111> is thus used, which has a high crystal quality. In addition, to obtain electrical characteristics comparable with the ones obtainable using a <100> substrate, the MOSFET 3 is appropriately sized. In particular, the MOSFET 3 is manufactured with greater dimensions than a corresponding MOSFET having equal electrical performances, formed in a <100> substrate, and the sizing is made, in a known way for the person skilled in the art, so as to compensate for the lower mobility of the electrons in the <111> substrate.

In the power device 1 of FIG. 1, the substrate 10 is highly conductive, and has dopant atoms, for example, with a doping concentration of $>10^{19}$ atoms/cm$^3$. The drain and the source regions 20, 21 have a doping concentration, for example $>10^{19}$ atoms/cm$^3$. As such, the drain and source regions 20, 21 are also highly conductive, even if they have a conductivity of an opposite type from that of the substrate 10. The epitaxial layer 11 has a lower conductivity than the substrate 10, and has dopant atoms with a lower concentration, typically from $10^{16}$ to $10^{17}$ atoms/cm$^3$, or even lower or higher (but still lower than the substrate 10) according to the breakdown voltage desired for the power device 1, as appreciable by a person skilled in the art. Also the thickness of the epitaxial layer 11 depends upon the desired breakdown voltage; for example, it may be 2-3 μm in the case of lower operating voltages (<10 V) and 5-10 μm in the case of higher voltages.

The enhanced region 23 enables reduction of the contact resistance of the second metal region 26.

With reference also to FIG. 2, representing the electrical equivalent of the power device 1 (integrated in a first chip 51) and of a possible driver 50, the third metal region 27 of the power device 1 of FIG. 1 forms a drain electrode D for the D-mode HEMT 2, which may be coupled to a drain pin 52 of the power device 1. The first metal region 25 forms a floating electrode for the source of the D-mode HEMT 2 and of the drain for the MOSFET 3, indicated as electrode INT(S/D) and may be coupled to a floating pin 53 of the power device 1; the second metal region 26 and the rear metal region 40 form source electrodes S for the MOSFET 3 and may be coupled together and to a source pin 54 of the power device 1; and the fourth metal region 35 forms, as said, a gate electrode G1 for the MOSFET 3 (which may be coupled to a first gate pin 55 of the power device 1). Furthermore, in a not shown way, the HEMT gate region 19 is coupled, through an own metallization forming a gate electrode G2 for the D-mode HEMT 2, to a second gate pin 56 of the power device 1.

Furthermore, as shown in FIG. 2, the driver 50 comprises a resistor 60, coupled between the first gate pin 55 and the source pin 54 of the power device 1; a driving stage 61, coupled between a first and a second supply lines 65, 66; and a power-up device 62, coupled between the first gate pin 55 and the first supply line 65, receiving a control signal Vin, and having an output coupled to the second gate pin 56 of the power device 1. The source pin 54 of the power device 1 is grounded.

The driver 50 is generally integrated in a second chip 68 separated from the first chip 51; in this case, the resistor 61 may be integrated in the second chip 68 or in the first chip 51 using any known technique.

The driving stage 61 may be of a standard type designed for working with E-mode HEMTs since the power device 1 is electrically equivalent to a known E-mode HEMT.

Thereby, the power device 1 has high efficiency, in particular in power-conversion applications, high switching frequency (it can work at frequencies beyond 1 MHz), requires a reduced area, and therefore has lower costs than a non-integrated solution.

Figures 3, 4:
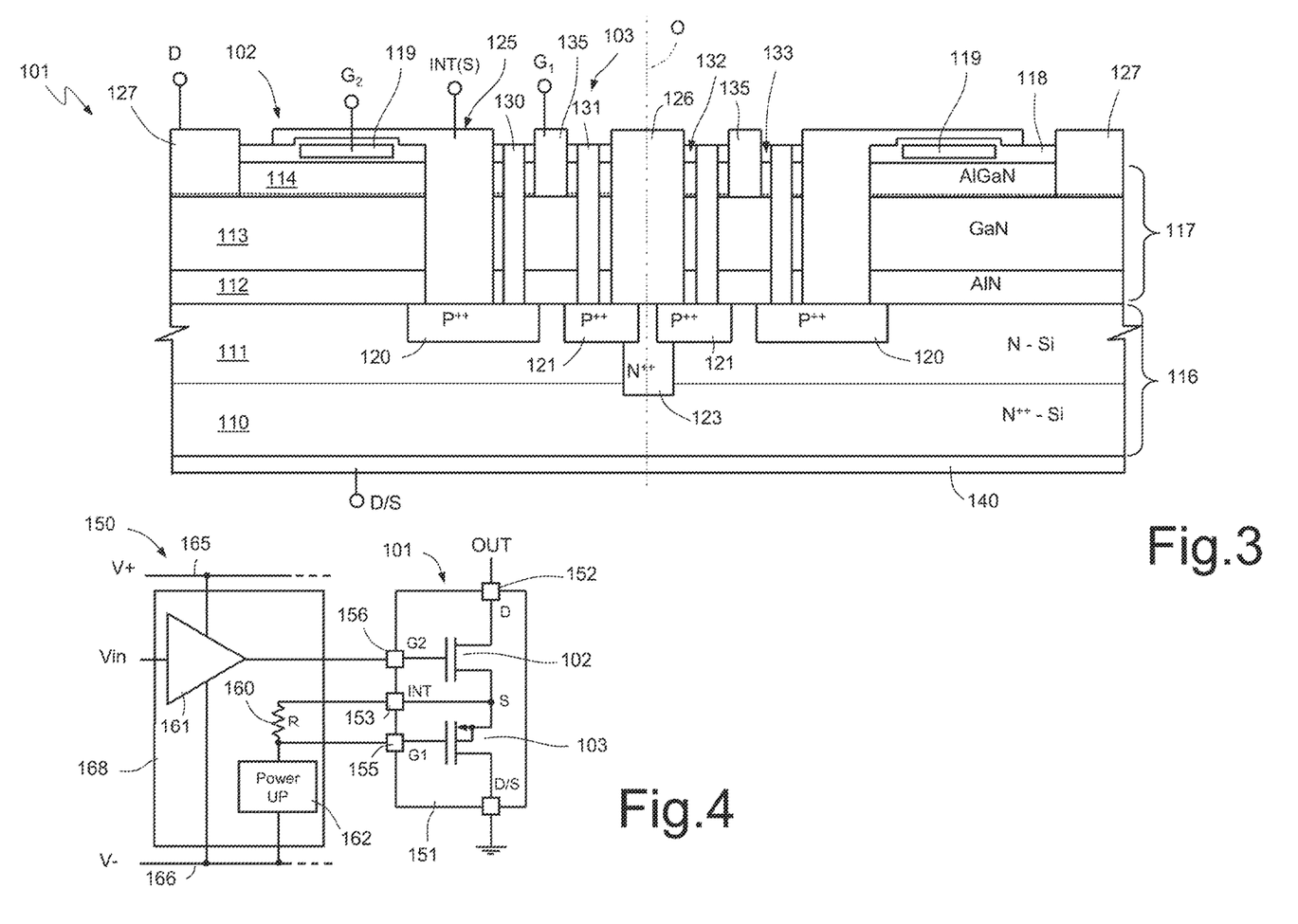
FIG. 3 is a cross-section of another embodiment of the present HEMT power device.
FIG. 4 is an electrical diagram of a circuit including the HEMT power device of FIG. 3.

FIGS. 2 and 3 show a different embodiment, where the power device, now designated by 101, is formed in a base layer 116 of an N-type and therefore comprises, in addition to a HEMT 102, a P-channel MOSFET 103.

The power device 101 has a structure similar to the power device 1 of FIG. 1 and, in top plan view, may have the same structure shown in FIG. 1A. Consequently, the structures (layers and regions) similar to the homologous structures of FIG. 1 are designated by reference numbers increased by 100 and will not be described in detail, and FIG. 1A may be useful for also understanding the type of the device 101, increasing the reference numbers of FIG. 1A by 100.

In detail, in the power device 101, the epitaxial layer 111 houses a source region 120 and a drain region 121, of a P-type; namely, the source region 120 is electrically coupled to the first metal region 125 and surrounds at a distance the drain region 121 of the MOSFET 103. The enhanced region 123 is here of an N-type.

Furthermore, the first metal region 125 is connected to the outside via a terminal INT.

The power device 101 has the electrical equivalent shown in FIG. 4, which moreover represents a possible driver 150. Also in FIG. 4, the elements similar to those of FIG. 2 are designated by reference numbers increased by 100 and will not be described any further.

In the circuit of FIG. 4, the resistor 160 is coupled between the first gate pin 155 and the intermediate pin 153 of the power device 101. Furthermore, the power-up device 162 is coupled between the first gate pin 155 and the second supply line 166.

Also in this case, the resistor 161 may be integrated in the second chip 168 or in the first chip 151, using any known technique.

Figures 5, 6:
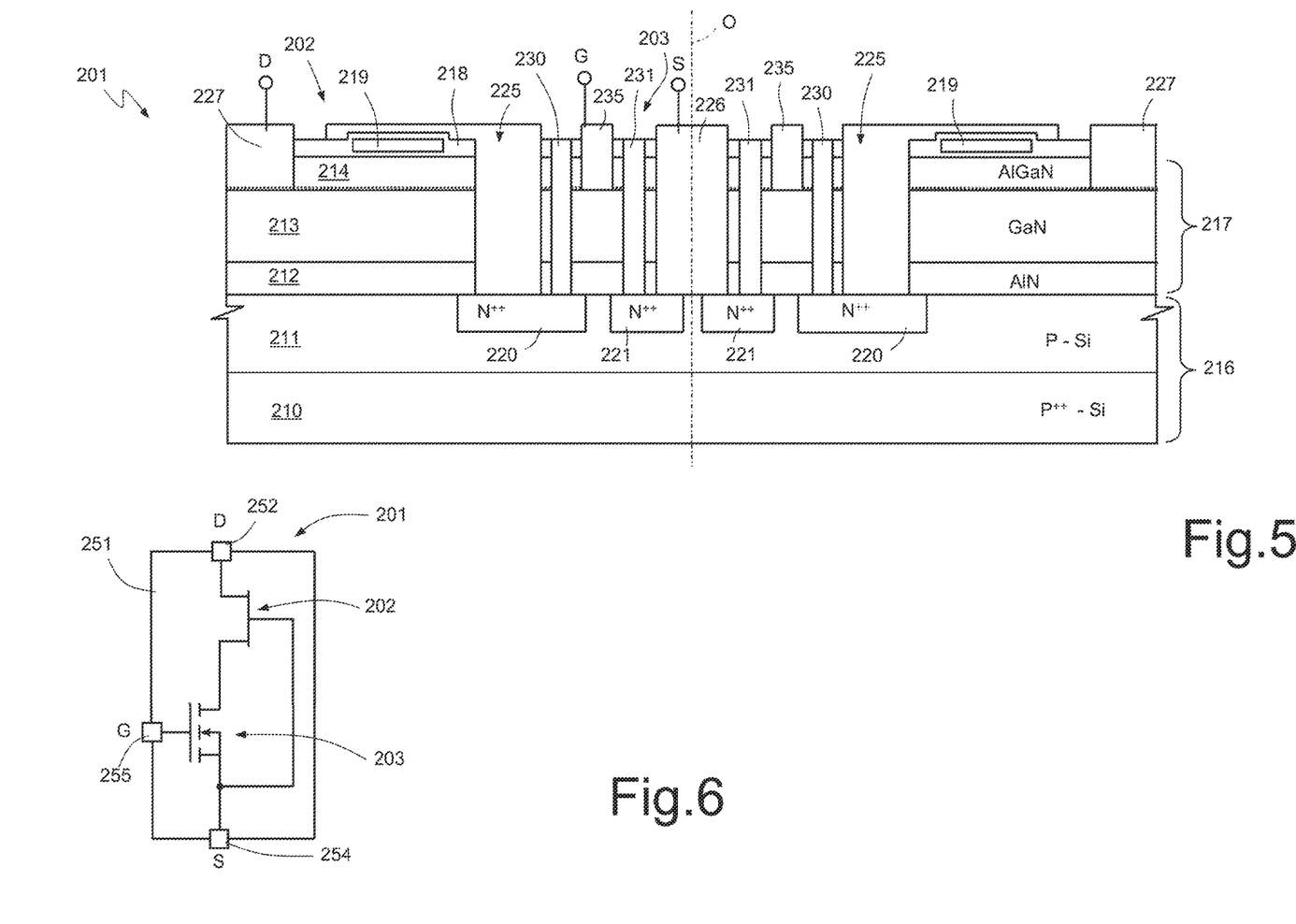
FIG. 5 is a cross-section of a different embodiment of the present HEMT power device.
FIG. 6 is an equivalent electrical diagram of the HEMT device of FIG. 5.

FIG. 5 shows an embodiment where the power device, here designated by 201, is obtained in a P-type base layer 216 and has a structure similar to that of the power device 1 of FIG. 1, except that it has no the enhanced region 23. Consequently, the structures (layers and regions) similar to the homologous structures of FIG. 1 are designated by reference numbers increased by 200 and will not be described in detail, and FIG. 1A may be useful for also understanding the type of the device 101, considering the reference numbers of FIG. 1A increased by 200.

Furthermore, in the power device 201 of FIG. 5, the rear metal region 40 of FIG. 1 is not present, and the source terminal S of the power device 201 is formed by the second metal region 226. Furthermore, in the power device 201, the HEMT gate region 219 is not connected separately with the outside, but, as shown in the electrical equivalent of FIG. 6, is electrically coupled to the second metal region 226 and to the source pin 254 of the power device 201. The power device 201 therefore has only three pins 252 (drain), 254 (source) and 255 (gate), and the driver (not shown) is connected to the latter.

Figures 7, 8:
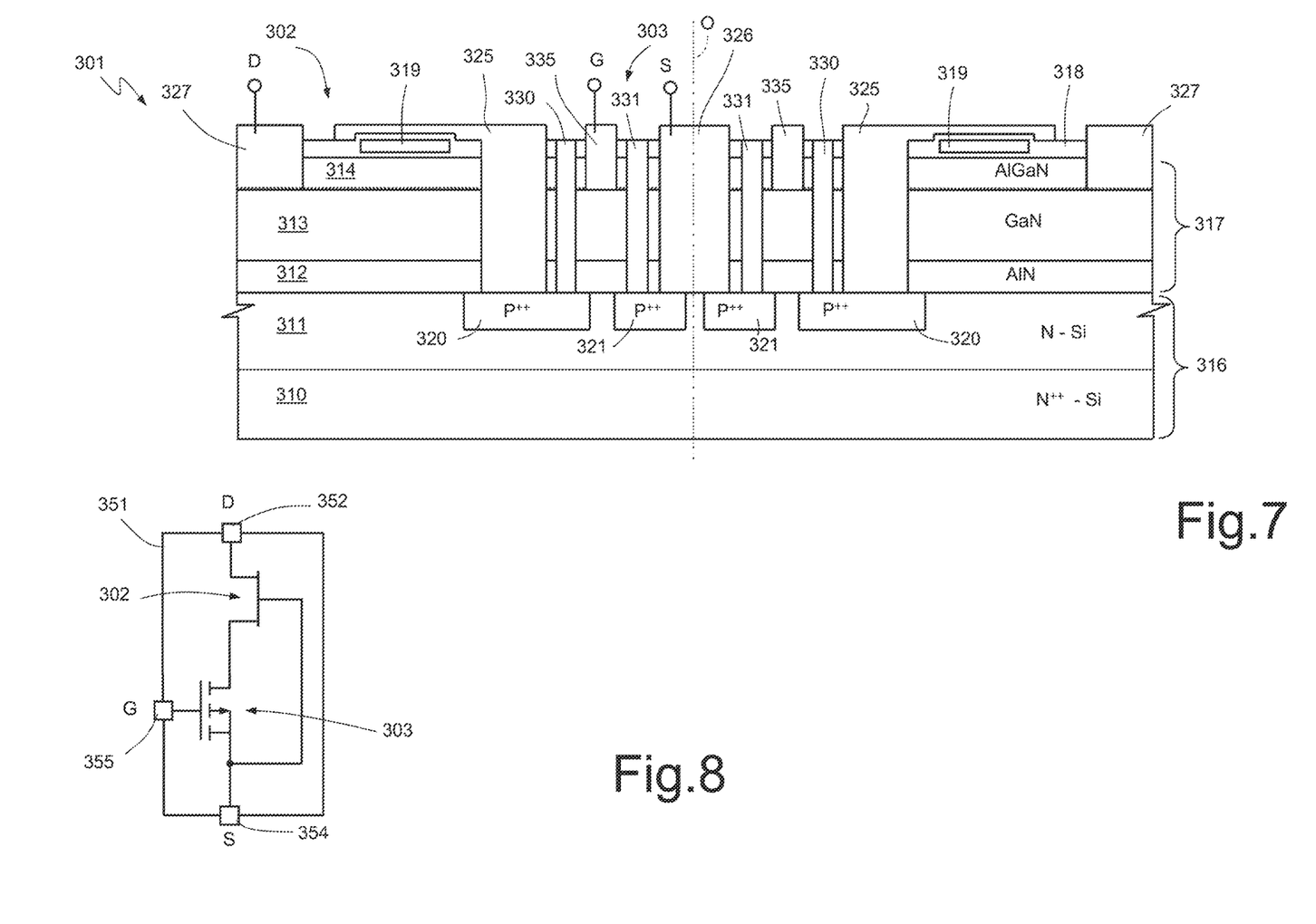
FIG. 7 is a cross-section of yet another embodiment of the present HEMT power device.
FIG. 8 is an equivalent electrical diagram of the HEMT power device of FIG. 7.

FIG. 7 shows an embodiment where the power device, here designated by 301, is formed in an N-type base layer 316 and has a structure similar to the power device 101 of FIG. 3, except that there is no enhanced region 123. Consequently, the structures (layers and regions) similar to the homologous structures of FIG. 3 are designated by reference numbers increased by 200 and will not be described in detail. Also in this case, FIG. 1A may be useful for understanding the type of the device 301, increasing the reference numbers of FIG. 1A by 300.

In the power device 301 of FIG. 7, the rear metal region 140 of FIG. 2 is not present, and the source terminal S of the power device 301 is connected to the drain region 321 of the MOSFET 303 through the second metal region 326. Furthermore, in the power device 301, the HEMT gate region 319 is not connected separately to the outside, as shown in the electrical equivalent of FIG. 8, but is electrically coupled to the second metal region 326 and to the source pin 354 of the power device 301. The power device 301 therefore has only three pins 352 (drain), 354 (source) and 355 (gate).

Hereinafter, the steps for manufacturing the power device 1 of FIG. 1 will be described with reference to FIGS. 9 to 19. The description below applies likewise (with the possible modifications of the used dopant and possibly the absence of the step for forming the enhanced regions 23, 123) for manufacturing the power devices 101, 201, and 301.

Figure 9:
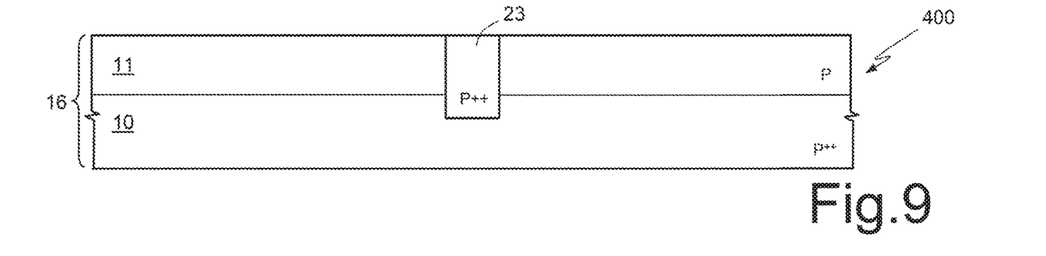
FIGS. 9-19 are cross-sections through a portion of a semiconductor material wafer in successive manufacturing steps of the device of FIG. 1.

FIG. 9 shows a wafer 400 of semiconductor material designed to form the base layer 16, at the end of the manufacturing steps, after sawing of the wafer. Consequently (as for the other layers), the same reference numbers of FIG. 1 will be used.

In FIG. 9, the base layer 16 (comprising the substrate 10 and the epitaxial layer 11 grown in a known way thereon) has already been subjected to usual photolithographic steps for selective implantation of the enhanced region 23.

Figure 10:
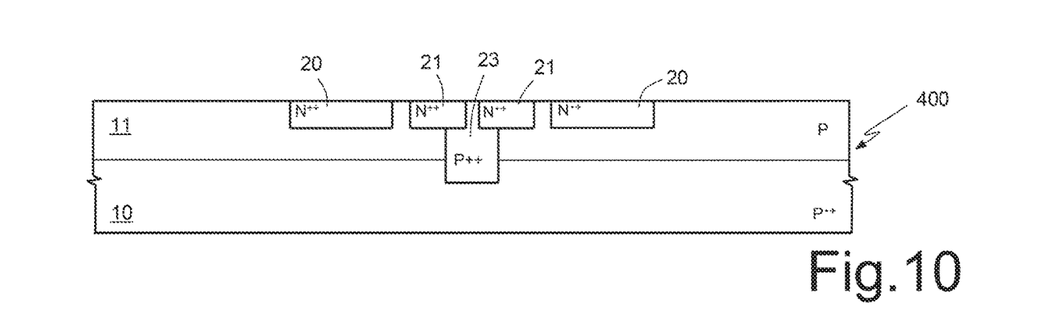
Figure 11:
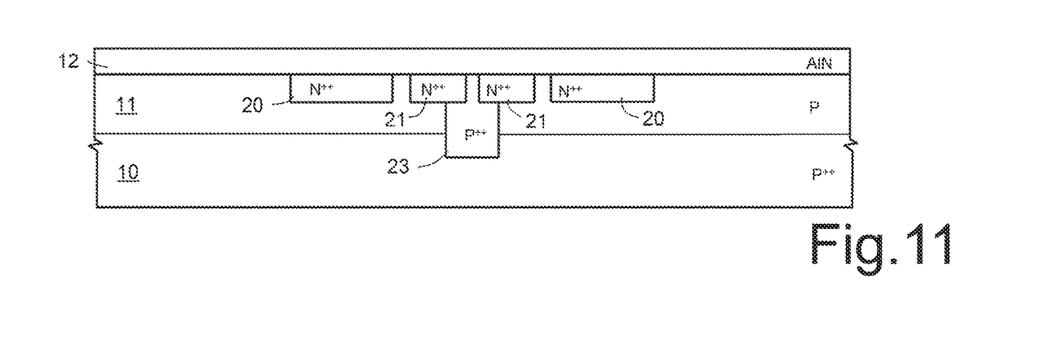

In FIG. 10, the wafer 400 is subjected to further photolithographic steps for implanting the drain and the source region 20, 21 with P-type dopant, for example boron, and for their diffusion.

Figure 12:
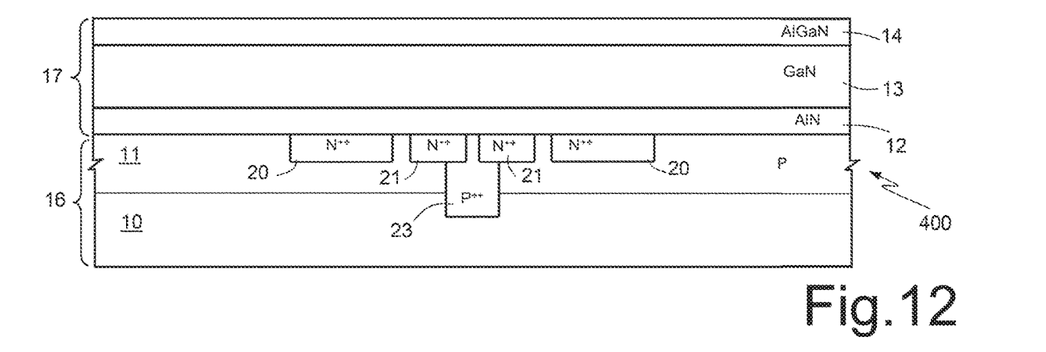
Figure 13:
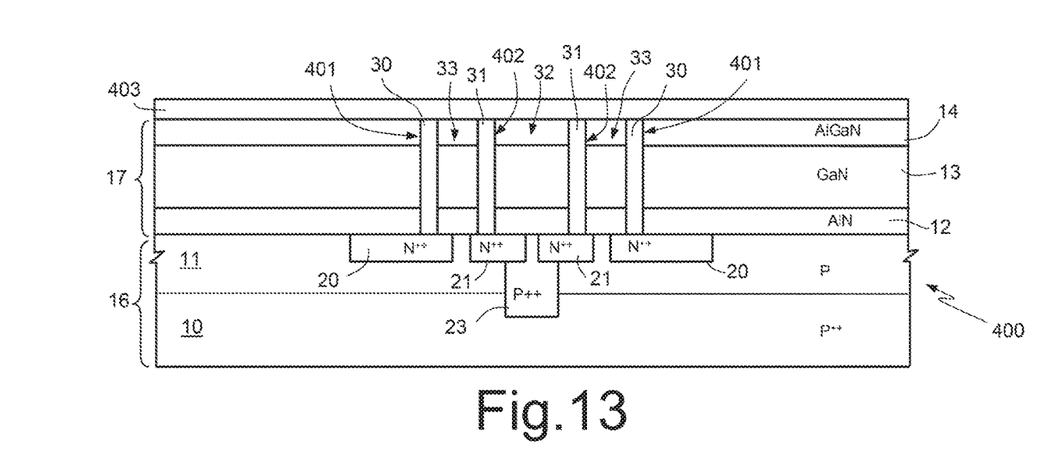

In FIG. 12, the dielectric layer 12 is deposited on the surface of the epitaxial layer 11 and, FIG. 13, the channel layer 13, of GaN, and the barrier layer 14, of AlGaN are grown thereon, in a known way, forming heterostructure layer 17.

Then, FIG. 13, the wafer 400 is deep etched to form first and second trenches 401, 402 extending though the heterostructure layer 17; the etch stops on the epitaxial layer 11. The first and the second trenches 401, 402 are then filled with dielectric material, such as silicon oxide or silicon nitride to form the electrical-insulation regions 30, 31, and therefore have the aforementioned shape thereof, in particular a tubular shape. In this way, inside the heterostructure layer 17, the first portion 32 and the second portion 33 of the heterostructure layer 17 are electrically insulated from each other and from the rest of the wafer 400. Then, a first insulating layer 403, of dielectric material such as silicon oxide, is deposited on the heterostructure layer 17.

Figure 14:
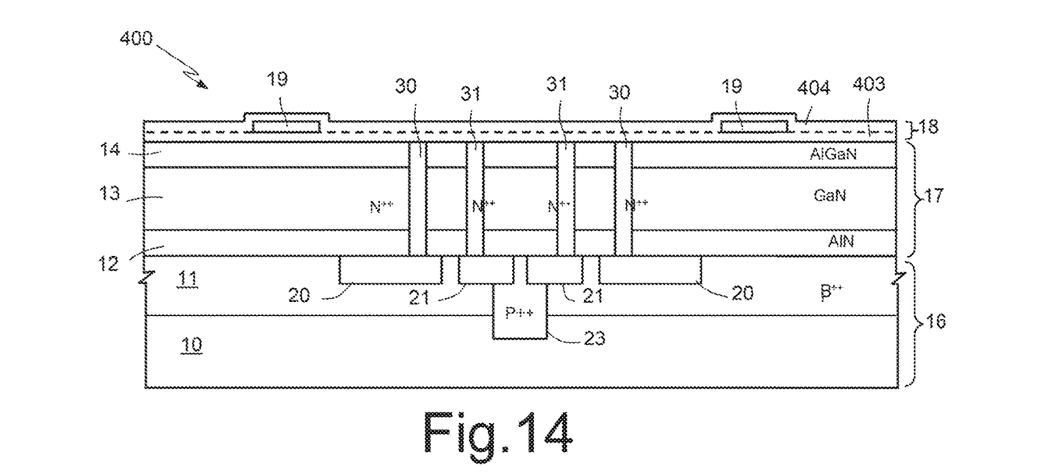

Next, FIG. 14, the HEMT gate region 19 is formed on the first insulating layer 403 by depositing and defining a conductive material, for example polycrystalline silicon or a metal, such as tungsten, titanium, aluminum; then a second insulating layer 404, of dielectric material, for example silicon oxide, is deposited. In practice, the first and the second insulating layers 403, 404 envelop and electrically insulate the HEMT gate region 19, thus forming the insulation/passivation layer 18.

Figure 15:
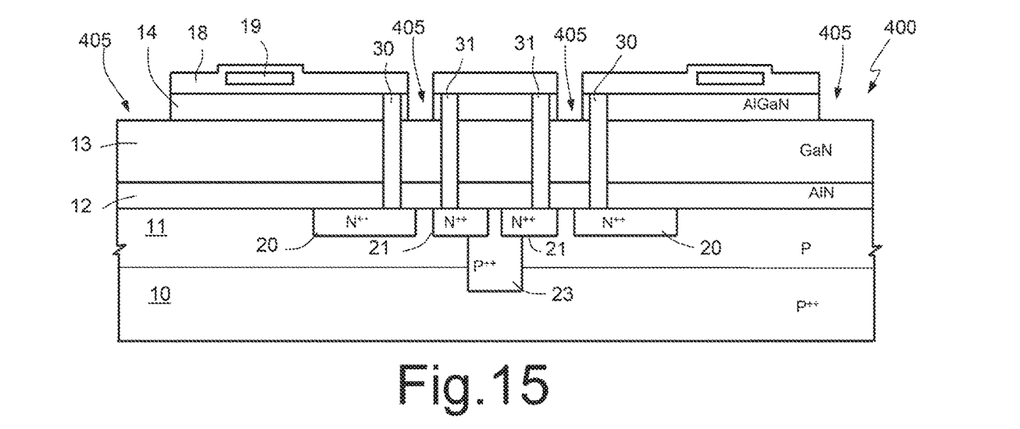
Figure 16:
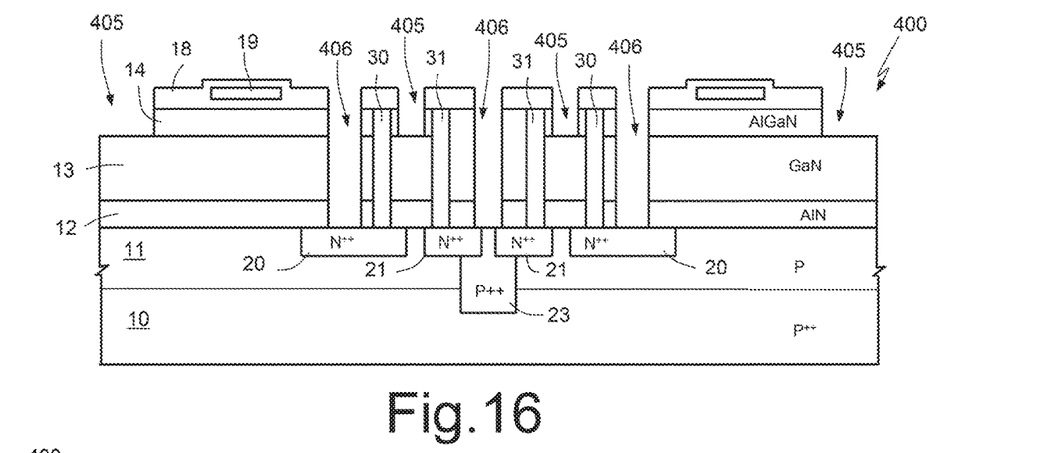

In FIG. 15, contacts are opened towards the MOSFET gate region 33A, the channel layer 13, and the drain region 20. To this end, the wafer 400 is masked, and the insulation/passivation layer 18 and the barrier layer 14 are etched, forming third trenches 405. Moreover, FIG. 16, before or after forming the third trenches 405, by deep etching the insulation/passivation layer 18, the barrier layer 14, the channel layer 13, and the dielectric layer 12, fourth trenches 406 are formed where it is desired to form the tubular portion 25A of the first metal region 25 and the second metal region 26.

Figure 17:
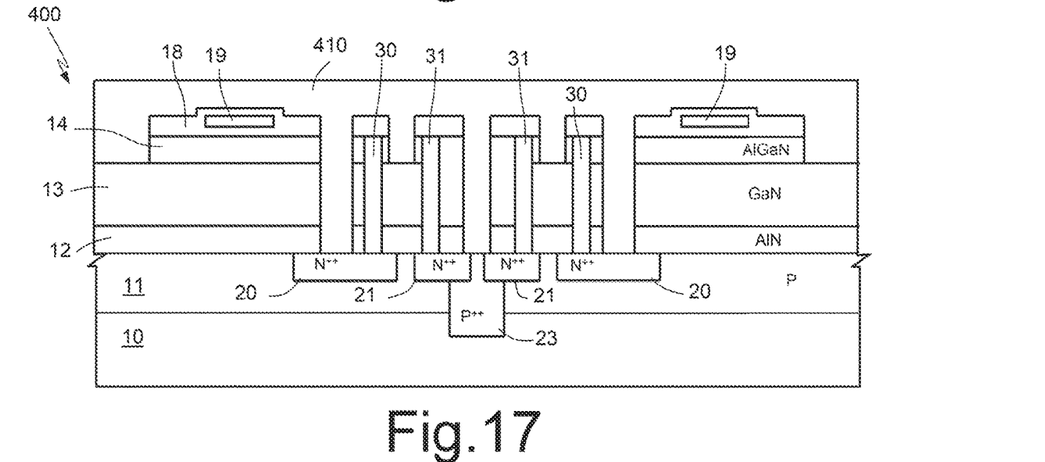
Figure 18:
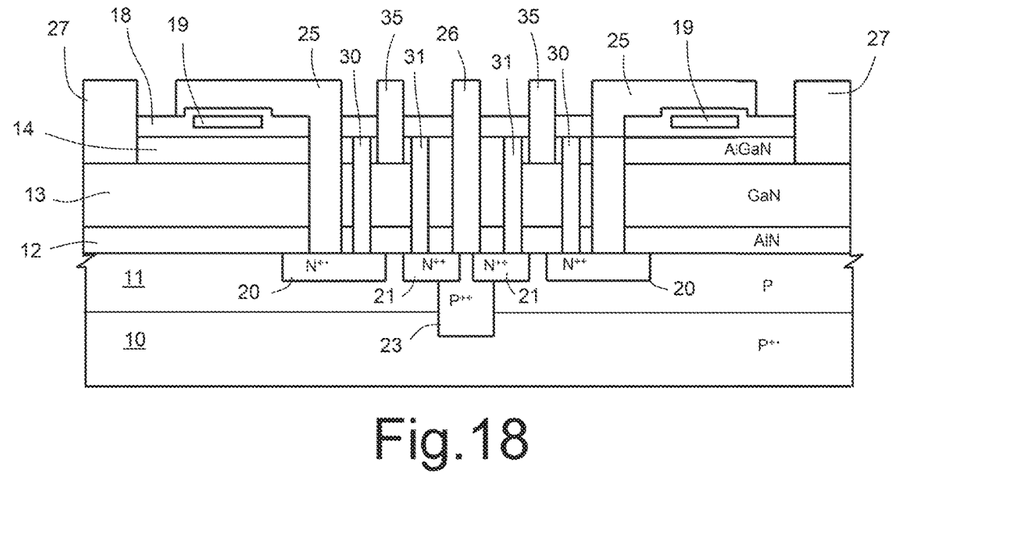
Figure 19:
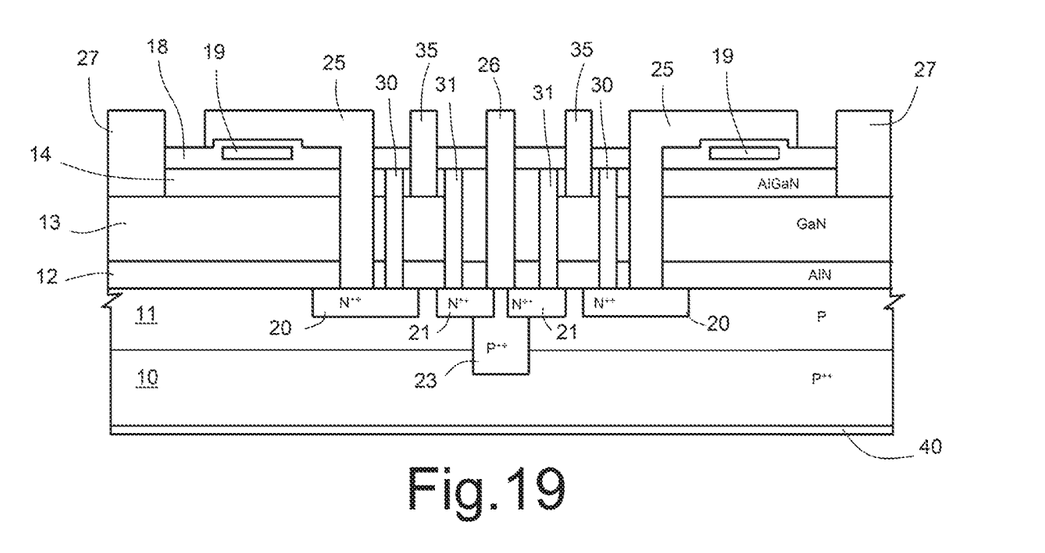

Then, FIG. 17, a metal layer 410, for example of aluminum, copper, tungsten or any alloy thereof, is deposited and fills the trenches 405, 406, and, FIG. 18, the metal layer 410 is photolithographically defined, to form the metal regions 25-27 and 35. In FIG. 19, the rear metal region 40 is formed on the bottom surface 5A of the wafer 400.

Finally, the wafer 400 is diced to form the single power devices 1.

As explained above, by virtue of the integration of the MOSFET 3, 103, 203, 303 in the same chip 51, 151, 251, 351 as the D-mode HEMT 2, 102, 202, 302, the power device 1, 101, 201, 301 can work at higher switching frequencies and in a more efficient way as compared to the discrete solutions. Integration is obtained, in a simple way using well-known process steps that can therefore be controlled individually in an effective and reliable way, partially underneath the D-mode HEMT and therefore without requiring any further area. The shown solution is thus very efficient from the standpoint of the integration area and therefore of the costs of the finished power device.

Finally, it is clear that modifications and variations may be made to the power device and to the manufacturing process described and shown herein, without thereby departing from the scope of the present disclosure, as defined in the attached claims. For instance, the various embodiments described may be combined to provide further solutions.

Furthermore, the three-dimensional structure may vary with respect to the above description. For instance, the source and drain regions, the metal regions, and the electrical-insulation regions may extend transverse to the drawing plane, i.e., in the direction Y. The structure may comprise only half of the shown structures (for example, it may comprise only the portions to the left or to the right of the central axis O of FIG. 1). Alternatively, the structure may have, in top plan view, a rectangular, square or oval shape, instead of being circular, or may be formed with a circular symmetry about one of the edges (the left-hand edge or the right-hand edge) of FIG. 1 (i.e., about the third metal region—drain metal 27). The variants referred to may obviously apply also to the embodiments of FIGS. 3, 5, and 7.

The materials, dimensions, and conductivity levels referred to may be modified according to the electrical characteristics that it is desired to achieve as known to the person skilled in the art.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high-electron-mobility transistor (HEMT) power device, comprising:
in a same chip:
a base body of semiconductor material;
a heterostructure layer on the base body;
a depletion mode (D-mode) HEMT including a channel area in the heterostructure layer and a first metal region extending through the heterostructure layer; and
a MOSFET transistor in cascade coupled to the D-mode HEMT, a first conduction region and a second conduction region each formed in the base body, the first metal region laterally in contact with the channel area and in electrical contact with the channel area and the first conduction region.

2. The power device according to claim 1, wherein:
the MOSFET transistor includes an insulated-gate region in the heterostructure layer and electrically insulated from the D-mode HEMT along a laterally direction.

3. The power device according to claim 2, wherein the base body includes silicon, and the heterostructure layer includes GaN—AlGaN.

4. The power device according to claim 2, wherein the base body includes a substrate of a crystallographic orientation and an epitaxial layer arranged between the substrate and the heterostructure layer.

5. The power device according to claim 2, wherein:
the heterostructure layer includes a dielectric layer extending over the base body, a channel layer extending over the dielectric layer, and a barrier layer extending over the channel layer;
the first and the second conduction regions of the MOSFET each interfaces with the dielectric layer;
the base body has a first conductivity type, and the first and the second conduction regions each has a second conductivity type that is different from the first conductivity type;
the insulated-gate region of the MOSFET transistor includes a gate-dielectric region formed in the dielectric layer and a gate electrode formed in the channel layer; and
the D-mode HEMT includes an insulated-gate region superimposed on the barrier layer and a second metal region extending through the barrier layer and in direct electrical contact with the channel layer, the first metal region extending through the barrier layer, the channel layer and the dielectric layer.

6. The power device according to claim 5, wherein the chip includes a third metal region extending through the barrier layer, the channel layer and the dielectric layer and in direct electrical contact with the second conduction region and the base body.

7. The power device according to claim 6, wherein the base body includes a substrate and an epitaxial layer arranged between the substrate and the heterostructure layer, the substrate having a doping level higher than the epitaxial layer, the epitaxial layer accommodating an enhanced region extending laterally with respect to the second conducting region, and in direct electrical contact with the second conduction region, the enhanced region having the first conductivity type and a higher doping level than the epitaxial layer; and
further comprising a third metal region in direct electrical contact with the enhanced region.

8. The power device according to claim 7, further comprising:
a fourth metal region extending through the barrier layer and in direct electrical contact with the gate electrode of the MOSFET; and
a first and a second electrical-insulation regions of an insulating material, the first and second electrical-insulation regions extending through the heterostructure layer and electrically insulating among one another of:
a first portion of the heterostructure layer accommodating the third metal region;
a second portion of the heterostructure layer accommodating the insulated-gate region and a gate electrode of the MOSFET, the second portion of the heterostructure layer also accommodating the fourth metal region; and
a third portion of the heterostructure layer housing the first metal region and the channel area.

9. An integrated circuit, comprising:
a driver circuitry; and
a power device including:
a depletion mode high-electron-mobility transistor (HEMT);
a MOSFET transistor; and
a first source/drain terminal of the HEMT being coupled to a first drain/source terminal of the MOSFET transistor, a gate of the HEMT being coupled to a first output node of the driver circuitry, a gate of the MOSFET transistor being coupled to a second output node of the driver circuitry that is different from the first output node, and a floating electrode being coupled between the first drain/source terminal of the HEMT and the first drain/source terminal of the MOSFET transistor.

10. The integrated circuit of claim 9, wherein the driver circuitry includes a resistive element coupled between the second output node of the driver circuitry and a second drain/source terminal of the MOSFET transistor.

11. A high-electron-mobility transistor (HEMT) power device, comprising:
a base body of a first conductivity type;
a first conduction region and a second conduction region in the base body, the first conduction region and the second conduction region each having a second conductivity type;
a heterostructure layer superimposed on the base body;
a channel area of a D-mode HEMT and an insulated-gate region of a MOSFET transistor in the heterostructure layer, the channel area and the insulated-gate region being insulated from one another; and
a first metal region extending through the heterostructure layer, laterally in contact with the channel area and electrically coupled to the channel area and the first conduction region.

12. The device according to claim 11, wherein the base body includes silicon, and the heterostructure layer includes GaN—AlGaN.

13. The device according to claim 11, wherein the base body includes a substrate having a crystallographic orientation and an epitaxial layer arranged between the substrate and the heterostructure layer.

14. The device according to claim 11, wherein the heterostructure layer includes:
a dielectric layer on the base body;
a channel layer on the dielectric layer; and
a barrier layer over the channel layer, and the device further comprising:
a first and a second electrical-insulation region of an insulating material in the heterostructure layer, at least one of the first or the second electrical-insulation regions electrically insulating the channel area of the D-mode HEMT from the insulated-gate region of the MOSFET transistor.

15. The device according to claim 14, wherein the insulated-gate region of the MOSFET transistor includes:
a gate-dielectric region in the dielectric layer; and
a gate electrode in the channel layer, the gate-dielectric region and the gate electrode being laterally delimited by the first and the second electrical-insulation region.

16. The device according to claim 15, further comprising a gate metal region extending through the barrier layer and in direct electrical contact with the gate electrode of the MOSFET transistor.

17. The device according to claim 14, further comprising:
a first metal region extending through the barrier layer, the channel layer and the dielectric layer and in direct electrical contact with the first conduction region; and
a second metal region extending through the barrier layer and in direct electrical contact with the channel layer.

18. The device according to claim 11, further comprising an insulated-gate region of the D-mode HEMT on a barrier layer above the channel area of the D-mode HEMT.

19. The device according to claim 14, further comprising a third metal region extending through the barrier layer, the channel layer and the dielectric layer, the third metal region in direct electrical contact with the second conduction region and the base body.

20. The device according to claim 19, wherein the base body includes a substrate and an epitaxial layer on the substrate, the substrate having the first conductivity type and a first doping level, the epitaxial layer having the first conductivity type and a second doping level lower than the first doping level; and
the device further comprising an enhanced region having the first conductivity type, and in direct electrical contact with the second conduction region from a lateral direction, the enhanced region having a higher doping level than the epitaxial layer, the third metal region in direct electrical contact with the enhanced region.

* * * * *